US006940361B1

(12) United States Patent
Jokio et al.

(10) Patent No.: US 6,940,361 B1
(45) Date of Patent: Sep. 6, 2005

(54) SELF-ALIGNED TRANSITION BETWEEN A TRANSMISSION LINE AND A MODULE

(75) Inventors: Kalle Jokio, Helsinki (FI); Olli Salmela, Helsinki (FI); Markku Koivisto, Espoo (FI); Mikko Saarikoski, Espoo (FI); Ali Nadir Arslan, Espoo (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/398,440

(22) PCT Filed: Oct. 6, 2000

(86) PCT No.: PCT/EP00/09799

§ 371 (c)(1),
(2), (4) Date: Sep. 22, 2003

(87) PCT Pub. No.: WO02/29923

PCT Pub. Date: Apr. 11, 2002

(51) Int. Cl.$^7$ .............................................. H01P 5/107
(52) U.S. Cl. ........................................ 333/26; 333/247
(58) Field of Search ............................ 333/26, 33, 247, 333/254

(56) References Cited

U.S. PATENT DOCUMENTS 5,793,263 A 8/1998 Pozar
6,664,874 B2 * 12/2003 Shirasaki .................... 333/247

OTHER PUBLICATIONS

Patent Abstracts of Japan, vol. 016, No. 307, Jul. 7, 1992 & JP 04 085986.

* cited by examiner

Primary Examiner—Benny Lee
(74) Attorney, Agent, or Firm—Squire, Sanders & Dempsey L.L.P.

(57) ABSTRACT

The invention relates to a method for forming a self-aligned transition between a transmission line (1) and a module (2) to be connected to said transmission line (1). The invention equally relates to such a module (2), to such a transmission line (1), to an intermediate element (5) possibly to be positioned between such a module (2) and such a transmission line (1), and finally to a system comprising such a transition. In order to enable a simple and precise connection of a transmission line (1) with some other module (2), it is proposed to use matching solder particles (8) and soldering pads on module (2) and transmission line (1) or intermediate element (5) respectively, and to apply a reflow treatment to the joined elements (1) and (2) or (5) and (2), thereby forming a self-aligning connection. The invention is to be applied particularly to waveguide-to-microstrip transitions.

16 Claims, 2 Drawing Sheets

SELF-ALIGNED TRANSITION BETWEEN A TRANSMISSION LINE AND A MODULE

FIELD OF THE INVENTION

The invention relates to a method for forming a self-aligned transition between a transmission line and a module to be connected to the transmission line. The invention equally relates to such a module, to such a transmission line, to an intermediate element possibly to be placed between such a module and such a transmission line, and finally to a system comprising such a transition.

BACKGROUND OF THE INVENTION

Transitions between transmission lines and other modules are employed in diverse systems. A common connection is, for example, a waveguide-to-microstrip transition. Usually, the requirements on the precision of the connection are high, since even small deviations will degrade the performance resulting in a considerable insertion loss. Especially waveguide-to-microstrip transitions are extremely sensitive to geometry errors. Simulations show that a length difference of only 50 microns in a microstrip can result in an insertion loss increase of 0.5 dB to 1.2 dB.

In practice, transmission lines and other modules are connected mechanically to provide the needed transition. To this end, screwing, soldering or similar methods are employed. Such methods lead, however, to rather inaccurate results and the tolerances can be quite large so that the requirements cannot be met satisfactorily. To connect transmission lines to other modules mechanically also constitutes an extremely difficult and time-consuming assembly phase. In addition, special tools, like registration devices and Computer Aided Enginering (CAE) tools, are required.

SUMMARY OF THE INVENTION

It is therefore an object of the invention to provide a method permitting a simple and precise connection of a transmission line with to some other module, to provide a module that can be connected easily and precisely to a transmission line, to provide an intermediate element that can be used for an easy and precise connection of a module to a transmission line and to provide a system comprising the transition of a transmission line to a module formed by a precise connection.

This object is achieved on the one hand by a method for forming a self-aligned transition between a transmission line and a module to be connected to the transmission line.

On the other hand, the object is reached by a module destined to form a self-aligned transition with a transmission line, an intermediate element and a transmission line destined to form a self-aligned transition with a module.

Finally, the object of the invention is solved by a system including a transmission line configured to provide a self-aligned transition with a module and a module destined to form a self-aligned transition with a transmission line.

The invention proceeds from the concept that a precise connection between a transmission line and another module can be realised by taking advantage of the behaviour of solder particles under reflow treatment. It is known to those skilled in the art that solder balls and other solder particles are self-aligning under reflow treatment due to surface tension phenomena in the solder material. Accordingly, under reflow treatment, slight misalignment is corrected by the surface tension forces, making it unnecessary to use any additional procedures for alignment. When using a reflow soldering of solder particles for transitions between transmission lines and modules, as proposed by the invention, a very precise connection of transmission line and module can be achieved, thereby reducing considerably the resulting insertion losses.

The proposed method and the corresponding module, transmission line, intermediate element and system are also less expensive than those known in the state of the art, since no extra tools and work phases are required aside from the simple reflow treatment, which should be performed also with the methods according to the state of the art.

Two basic alternatives are proposed for the method, the module, the transmission line and the system according to the invention, both alternatives being based on the above described principle. According to the first alternative, module and transmission line are connected or destined to be connected directly to each other. According to the second alternative, module and transmission line are connected or destined to be connected to each other via an intermediate element, for example a printed circuit board. The second alternative has the advantage of a facilitated application of the soldering pads and of a facilitated connection by reflow soldering.

In a preferred embodiment of the method according to the invention, the soldering pads are provided by using a solder mask, in particular by using a photolitographic pattering process. The employment of such a process results in a accuracy when connecting the module and the transmission line or the intermediate element respectively by reflow soldering. If an intermediate element is employed, this element can be fixed to the transmission line mechanically, for example by screws.

With the method and the elements proposed, any module—system module or single chip—can be attached with good precision to a transmission line. The invention is aimed especially at attaching a microstrip or similar, a coplanar waveguide or similar, or a T/R (transmitter/receiver) or similar module to a transmission line, since these connections require a particular accuracy of positioning. If the transmission line concerned is a waveguide (WG), it can have any cross-section required, e.g. a rectangular, a ridged or a circular cross-section.

The solder particles provided on the module can be of Ball Grid Array (BGA) type, of Column Grid Array (CGA) type, or even of flip-chip type, if only a single chip is attached, instead of a whole system module.

BRIEF DESCRIPTION OF THE FIGURES

In the following, the invention is explained in more detail with reference to drawings, of which FIG. 1 schematically shows a first embodiment of the invention.

DETAILED DESCRIPTION OF THE INVENTION

Figure 1:
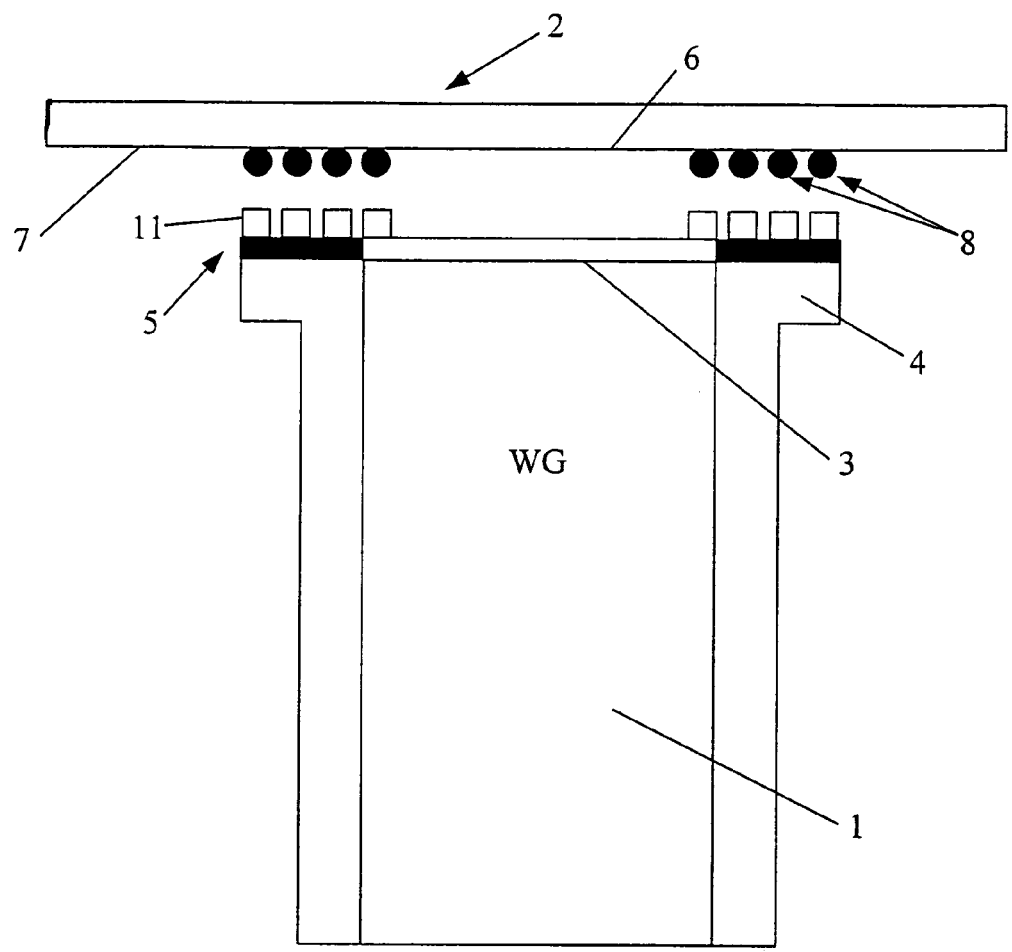

FIG. 1 illustrates the principle of the invention. To this end, it shows a sectional view of the elements of a system according to the invention before being connected.

A partly depicted rectangular waveguide 1 forms the transmission line of the system. At its open end 3, the waveguide 1 has an enlarged rim 4, on which an intermediate element 5 with a middle-opening has been fixed.

Above the open end 3 of the waveguide 1, a simple microstrip structure 2 is depicted. This microstrip 2 represents a system module that is to be connected to the waveguide 1. The microstrip 2 has an aperture 6 in its ground plane 7, by which it is to be coupled with the open end 3 of the waveguide 1 in order to form a transition.

The microstrip 2 is provided at its ground plane 7 with solder balls 8 in a Ball Grid Array (BGA) or a similar type of joining technique, the solder balls 8 being arranged closely around the aperture 6 in the ground plane 7.

On top of the intermediate element 5 there are formed soldering pads 11 corresponding to the arrangement of solder balls 8 by using a solder mask. The solder mask definition is done using photolitographic patterning.

Following the situation depicted in FIG. 1, the microstrip 2 is placed onto the waveguide 1 in a way that the solder balls 8 come to rest on the soldering pads 11 of the intermediate element 5. After that, a reflow soldering process is carried out, combining the microstrip 2 with the intermediate element 5 and thereby with the waveguide 1.

By this procedure, the waveguide 1 is attached to the microstrip 2 with very good accuracy. Even if the original placement of the microstrip 2 on the intermediate element 5 has been slightly inaccurate, the soldering process will set the microstrip 2 to exactly the right location, because of the surface tension of the solder material.

Figure 2:
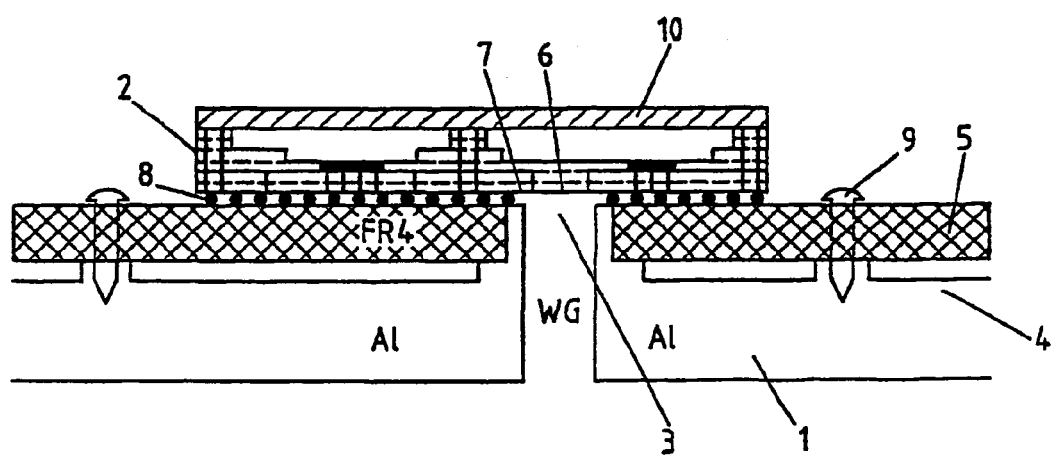
FIG. 2 schematically shows a second embodiment of the invention.

The second embodiment shown in FIG. 2 represents a more complex system according to the invention with a whole system module being connected to a waveguide to form a waveguide-to-microstrip transition. Corresponding parts are referred to with the same reference signs as in FIG. 1.

At the bottom of FIG. 2, a waveguide (WG) 1 made up of aluminium (Al) is depicted. The waveguide (WG) 1 is plated with an inert metal such as gold, in order to maintain a low-loss characteristic.

A FR-4 (a thermoset glassfiber-epoxy laminate) printed circuit board 5 comprising a middle-opening forms the intermediate element of the system and is attached to the rim 4 of the open end 3 of the waveguide 1 with screws 9. The rim 4 of the waveguide 1, the printed circuit board 5 and the holes for the screws in both of them are designed to guarantee a defined relative position between the waveguide 1 and the board 5 when fixed. On top of the FR-4 printed wiring board 5 there is attached a ceramic module 2 with a KOVAR (an alloy composed of nickel, iron and cobalt) lid 10 by BGA-type solder balls 8. An aperture 6 in the ground plane 7 of the module 2 is positioned exactly above the opening of the waveguide 1 at its open end 3.

Figure 3:
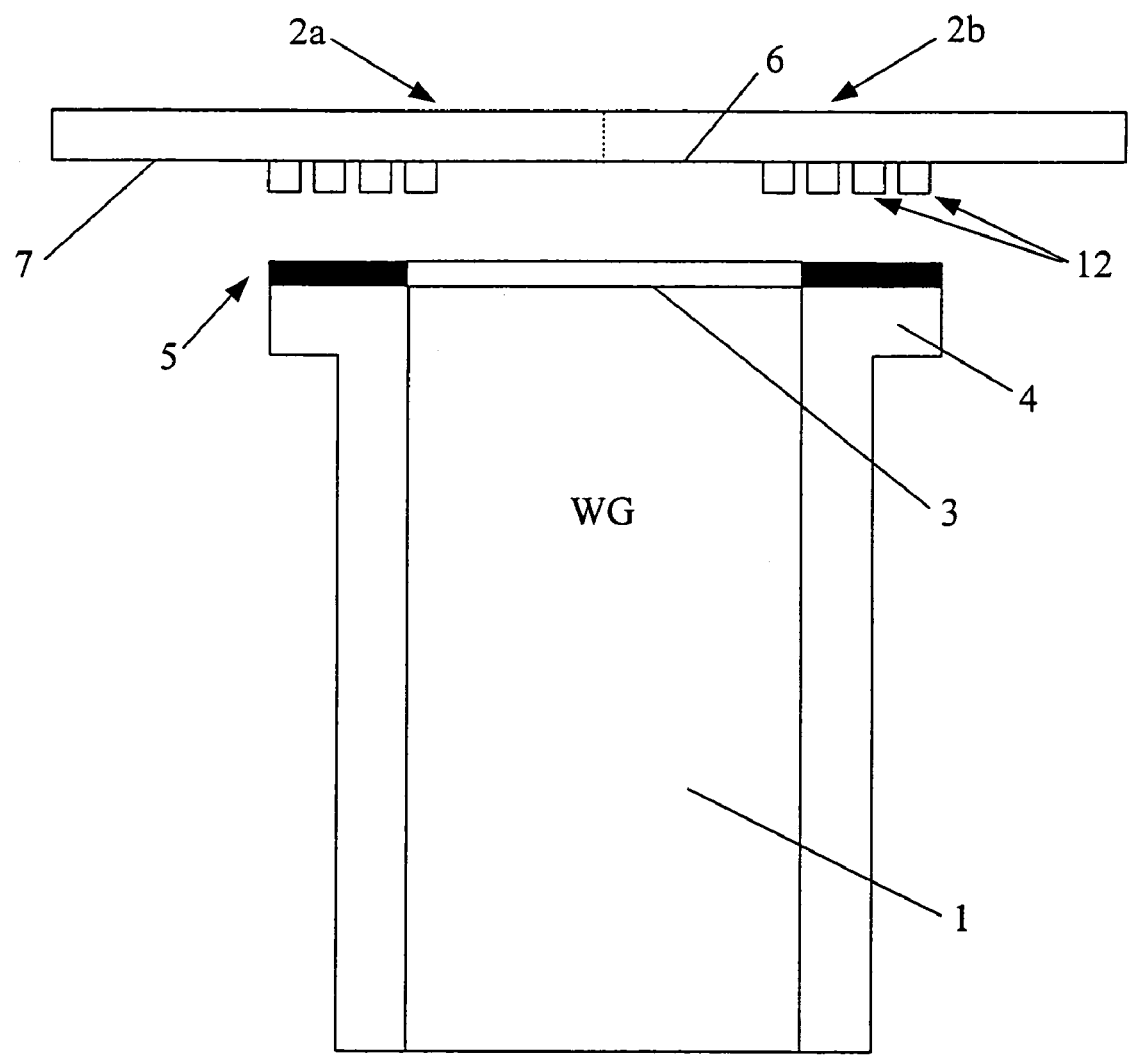
FIG. 3 schematically shows a third embodiment of the invention.

FIG. 3 illustrates a partly depicted rectangular waveguide (WG) 1 forming the transmission line of the system. At its open end 3, the waveguide (WG) 1 has an enlarged rim 4, on which an intermediate element 5 with a middle-opening has been fixed.

Above the open end 3 of the waveguide 1, a simple microstrip structure 2a is depicted. This microstrip 2a represents a system module that is to be connected to the waveguide 1. The microstrip 2a has an aperture 6 in its ground plane 7, by which it is to be coupled with the open end 3 of the waveguide 1 in order to form a transition.

The microstrip 2a is provided at its ground plane 7 with solder particles 12 in a Column Grid Array (CGA) or a similar type of joining technique, the solder particles 12 being arranged closely around the aperture 6 in the ground plane 7. Additionally, FIG. 3 illustrates a transmitter/receiver module 2b which is included in the system module.

The system was assembled as follows:

The ceramic module 2 was provided with BGA-type solder balls 8 and the FR-4 printed wiring board 5 with a corresponding arrangement of soldering pads 11. Thereupon, the FR-4 printed wiring board 5 was soldered by reflow with the ceramic module 2. Only after that, the whole entity made up of module 2 and printed wiring board 5 was placed on top of the waveguide structure 1. Finally, the FR-4 printed wiring board 5 combined with the ceramic module 2 was attached mechanically to the waveguide structure 1 with screws 9.

What is claimed is:

1. A system, comprising:
   a transmission line to which an intermediate element is fixed or configured to be fixed by screws, the transmission line being configured to provide a self-aligned transition with a module;
   the intermediate element fixed to or configured to be fixed to a rim of an open end of the transmission line designated for connection to the module, said intermediate element comprising an arrangement of soldering pads configured to match and to be soldered by reflow with solder particles arranged on the module to be connected to said transmission line, thereby providing a self-aligned transition; and
   the module destined to form the self-aligned transition with the transmission line and provided with the arrangement of solder particles that are configured to match and to be soldered by reflow to the soldering pads arranged on the intermediate element fixed to or configured to be fixed to the rim of the transmission line,
   wherein the transmission line is connected by reflow soldering via the intermediate element to the module.

2. A method for forming a self-aligned transition between a transmission line and a module to be connected to said transmission line, comprising the steps of:
   a) providing the module with an arrangement of solder particles in an area designated for the connection of said module to the transmission line;
   b) providing an intermediate element fixed to or suited to be fixed to the rim of an open end of the transmission line designated for the connection to the module with an arrangement of soldering pads corresponding to the arrangement of solder particles on the module;
   c) placing the module with the solder particles thereof onto the soldering pads and connecting the module to the intermediate element by reflow soldering; and
   d) in case the intermediate element is not fixed to the transmission line, fixing the intermediate element with a face opposite to the soldering pads to the transmission line.

3. The method according to claim 2, wherein in step d) the intermediate element is fixed to the transmission line mechanically, by screwing.

4. The method according to claim 2, wherein in step b) the soldering pads are provided by using and a photolitographic patterning process.

5. A module destined to form a self-aligned transition with a transmission line and provided with an arrangement of solder particles that are configured to match and to be soldered by reflow to soldering pads arranged on the rim of an open end of the transmission line designated for connection with the module or on an intermediate element fixed to or configured to be fixed to such a rim of the transmission line.

6. The module according to claim 5, said module comprising a microstrip, said microstrip comprising a strip conductor or a coplanar waveguide, with an aperture in a ground plane for forming a transition to a transmission line, and wherein the solder particles are arranged to surround said aperture.

7. The module according to claim 5, said module comprising a Transmitter/Receiver (T/R) module.

8. The module according to claim 5, said module comprising a system module or a single chip.

9. The module according to claim 5, wherein the solder particles are a Ball Grid Array (BGA), a Column Grid Array (CGA), or a flip-chip.

10. An intermediate element fixed to or configured to be fixed to a rim of an open end of a transmission line designated for connection to a module, said intermediate element comprising an arrangement of soldering pads configured to match and to be soldered by reflow with solder particles arranged on a module to be connected to said transmission line, thereby providing a self-aligned transition.

11. A transmission line to which the intermediate element according to claim 10 is fixed or configured to be fixed by screws, the transmission line being configured to provide a self-aligned transition with a module.

12. The transmission line according to claim 11, said transmission line comprising a waveguide.

13. A transmission line configured to provide a self-aligned transition with a module and comprising an arrangement of soldering pads configured to match and to be soldered by reflow with solder particles arranged on such a module, said arrangement being disposed on a rim of an open end of the transmission line.

14. A system comprising:

a transmission line configured to provide a self-aligned transition with a module and comprising an arrangement of soldering pads configured to match and to be soldered by reflow with solder particles arranged on said module, said arrangement being disposed on a rim of an open end of the transmission line; and a module destined to provide the self-aligned transition with the transmission line and provided with the arrangement of solder particles that are configured to match and to be soldered by reflow to the soldering pads arranged on the rim of the open end of the transmission line designated for connection with the module.

15. A method for forming a self-aligned transition between a transmission line and a module to be connected to said transmission line, comprising the steps of:

a) providing the module with an arrangement of solder particles in an area designated for the connection of said module to the transmission line;

b) providing a rim of an open end of the transmission line designated for the connection to the module with an arrangement of soldering pads corresponding to the arrangement of solder particles on the module;

c) placing the module with the solder particles thereof onto the soldering pads and connecting the module to the rim of the open end of the transmission line by reflow soldering.

16. The method according to claim 15, wherein in step b) the soldering pads are provided by using a photolitographic patterning process.

* * * * *